(12) United States Patent
Ling et al.

(10) Patent No.: US 12,521,459 B2
(45) Date of Patent: Jan. 13, 2026

(54) SYSTEM, METHOD AND APPARATUS FOR DISINFECTION WITH ULTRAVIOLET (UV) RADIATION

(71) Applicants: AGENCY FOR SCIENCE, TECHNOLOGY AND RESEARCH, Singapore (SG); OTSAW DIGITAL PTE. LTD., Singapore (SG)

(72) Inventors: Ting Ming Ling, Singapore (SG); Thanh Quang Tran, Singapore (SG); Ronnie Jin Wah Teo, Singapore (SG)

(73) Assignees: AGENCY FOR SCIENCE, TECHNOLOGY AND RESEARCH, Singapore (SG); OTSAW DIGITAL PTE. LTD., Singapore (SG)

( * ) Notice: Subject to any disclaimer, the term of this patent is extended or adjusted under 35 U.S.C. 154(b) by 500 days.

(21) Appl. No.: 17/925,914

(22) PCT Filed: Apr. 15, 2021

(86) PCT No.: PCT/SG2021/050213
§ 371 (c)(1),
(2) Date: Nov. 17, 2022

(87) PCT Pub. No.: WO2021/242171
PCT Pub. Date: Dec. 2, 2021

(65) Prior Publication Data
US 2023/0181782 A1    Jun. 15, 2023

(30) Foreign Application Priority Data

May 23, 2020   (SG) ............................ 10202004834P

(51) Int. Cl.
*A61L 2/24*    (2006.01)
*A61L 2/10*    (2006.01)

(52) U.S. Cl.
CPC .................. *A61L 2/24* (2013.01); *A61L 2/10* (2013.01); *A61L 2202/11* (2013.01); *A61L 2202/14* (2013.01); *A61L 2202/16* (2013.01)

(58) Field of Classification Search
CPC ...................................... A61L 2/24; A61L 2/10
See application file for complete search history.

(56) References Cited

U.S. PATENT DOCUMENTS 9,352,469 B2 *   5/2016   Stewart .................... B25J 5/007

FOREIGN PATENT DOCUMENTS

CN   108785698 A   11/2018
CN   111558078 A    8/2020
(Continued)

OTHER PUBLICATIONS

International Search Report for corresponding application PCT/SG2021/050213 filed Apr. 15, 2021; Mail date Jun. 23, 2021.
(Continued)

*Primary Examiner* — Sean E Conley
(74) *Attorney, Agent, or Firm* — CANTOR COLBURN LLP

(57) ABSTRACT

Disclosed is an apparatus for disinfection comprising a cylindrical housing; a plurality of ultra-violet light emitting diode (UV-LED) modules disposed on the circumference of the cylindrical housing, each UV-LED module comprising a heat sink; and a heat dissipation module disposed along the central axis of the cylindrical housing, the heat dissipation module arranged in thermal contact with the heat sink of each of the plurality of UV-LED modules; wherein each of the plurality of UV-LED modules is pivotably mounted onto the circumference.

16 Claims, 14 Drawing Sheets

(56) References Cited

FOREIGN PATENT DOCUMENTS

| | | | |
|---|---|---|---|
| CN | 111958613 A | 11/2020 | |
| CN | 211962982 U | 11/2020 | |
| WO | WO-2016077403 A1 * | 5/2016 | ............... A61L 2/10 |

OTHER PUBLICATIONS

Written Opinion for corresponding application PCT/SG2021/050213 filed Apr. 15, 2021; Mail date Jun. 23, 2021.

* cited by examiner

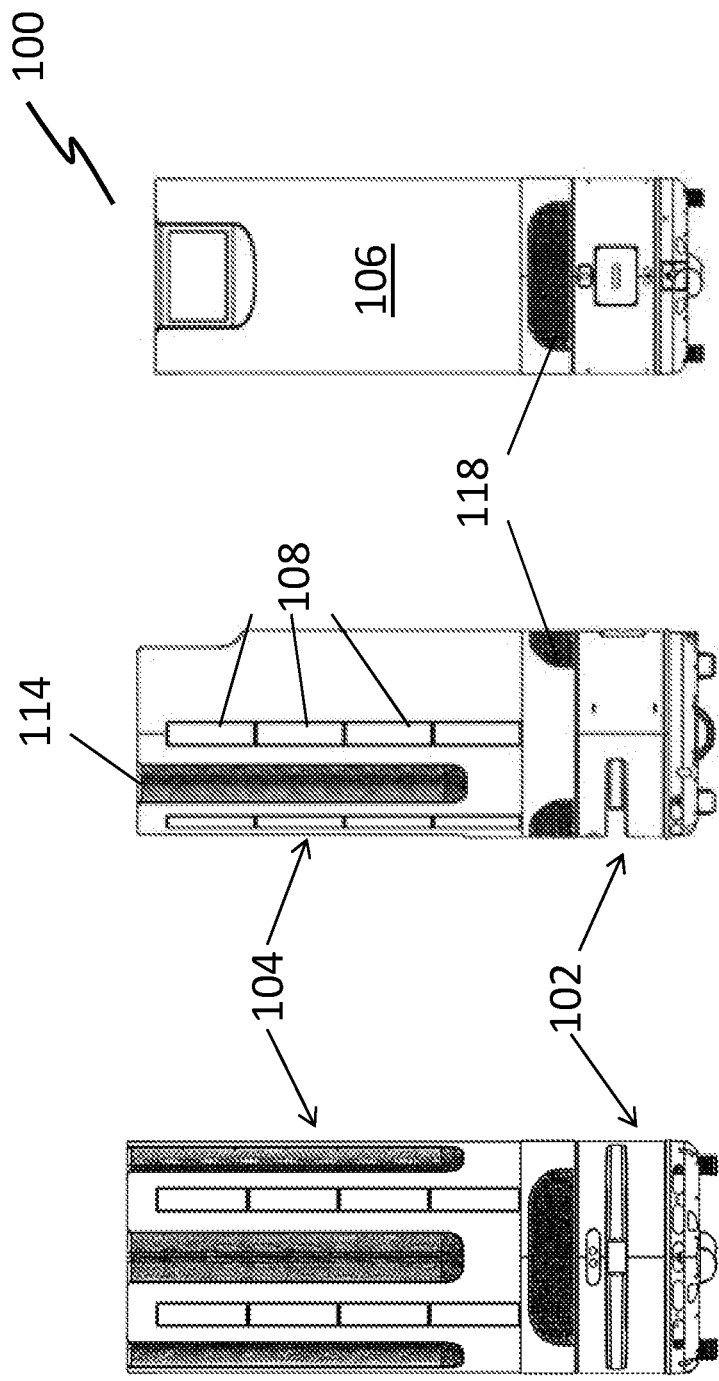

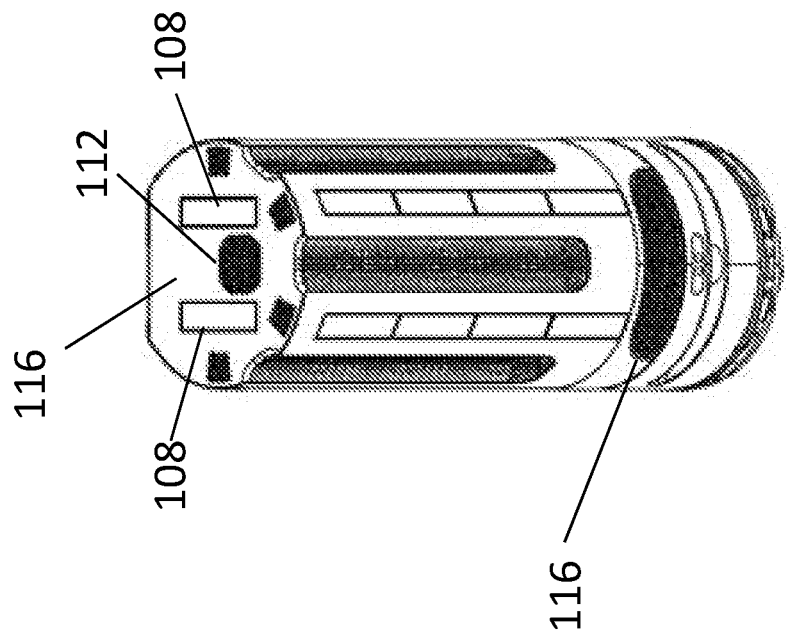
Figure 1e (perspective)
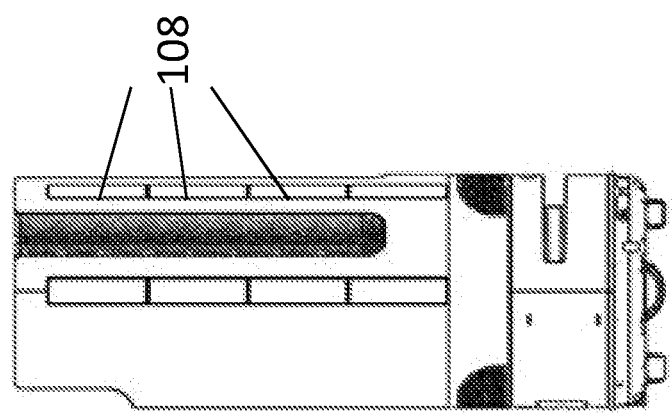
Figure 1d (right)

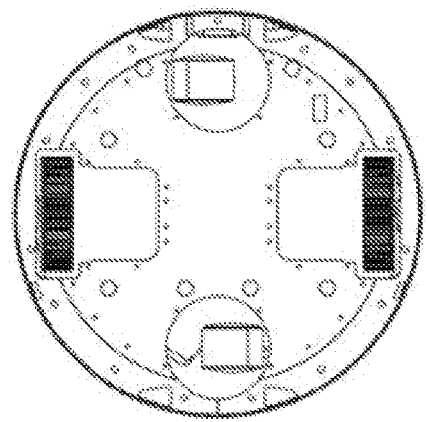
Figure 1g (plan-bottom)
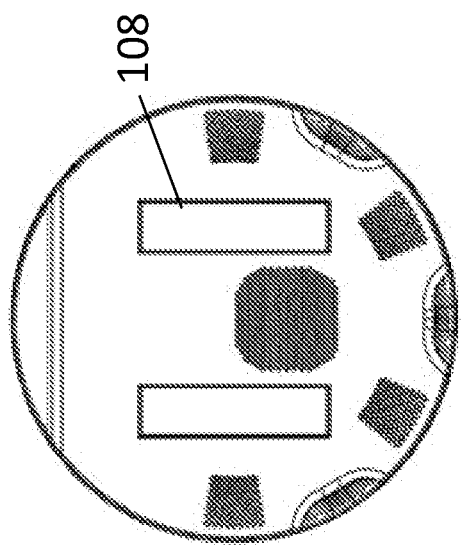
Figure 1f (plan-top)

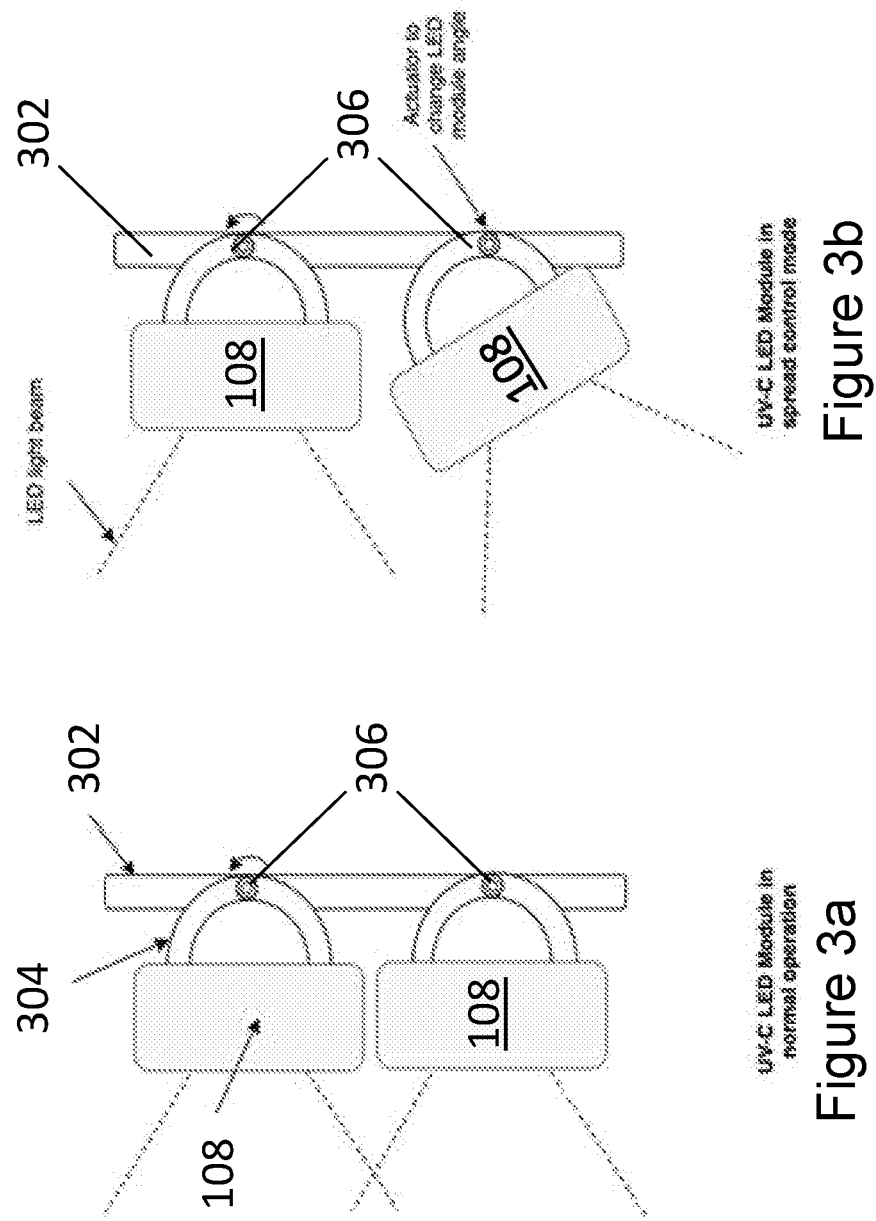

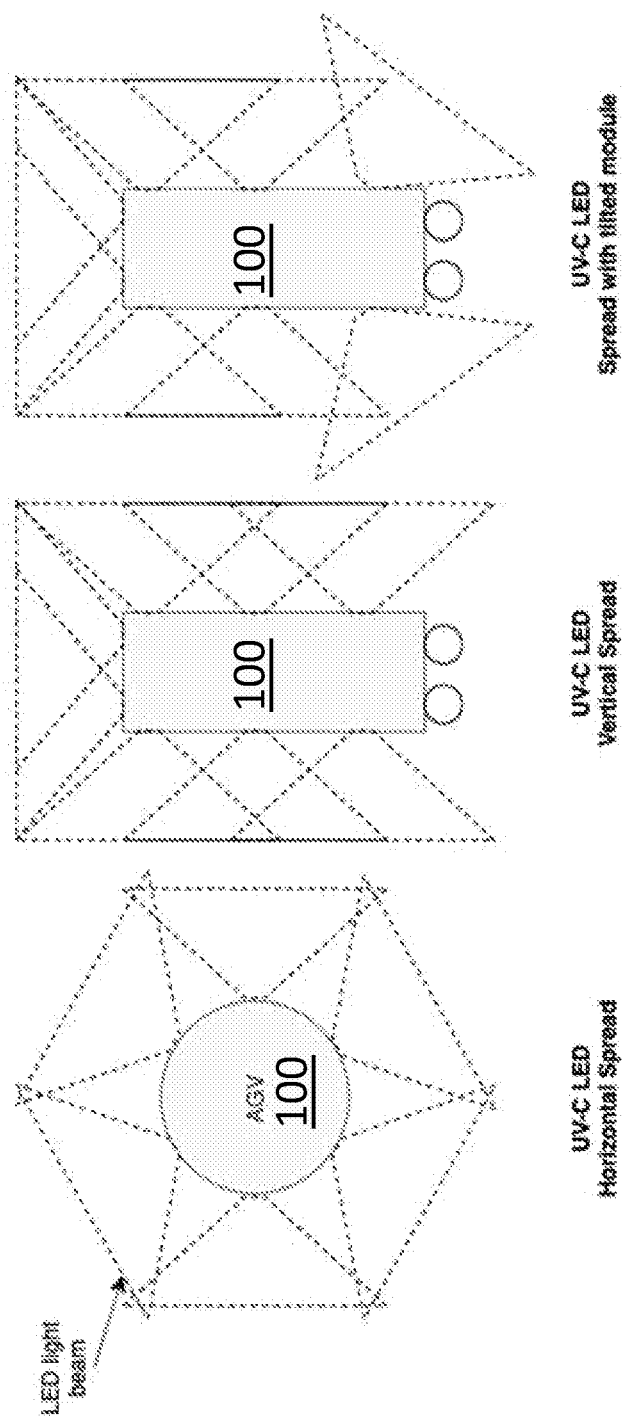

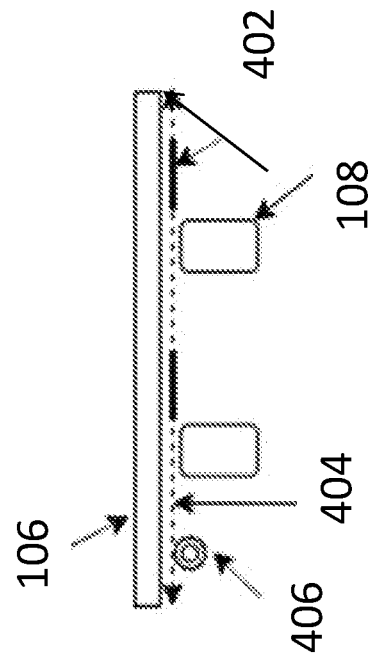
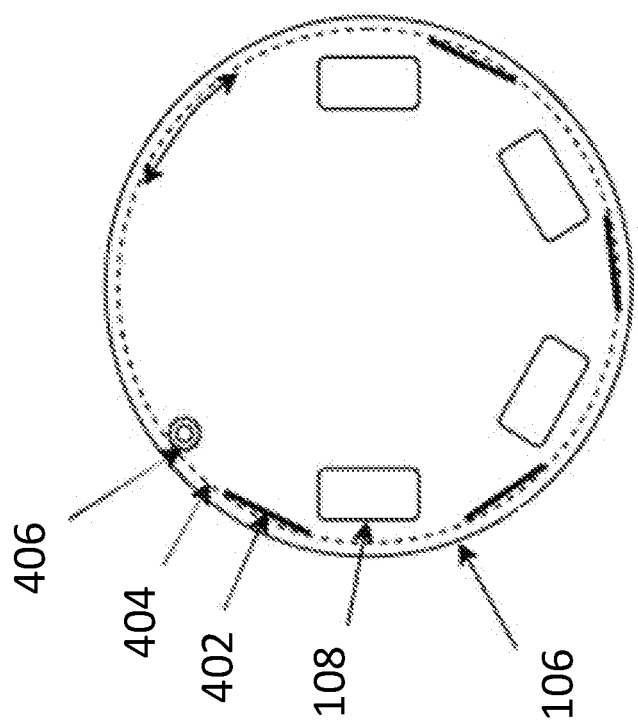
Figure 4b
Figure 4a

SYSTEM, METHOD AND APPARATUS FOR DISINFECTION WITH ULTRAVIOLET (UV) RADIATION

TECHNICAL FIELD

The present disclosure relates to a system, method and apparatus for providing disinfectant.

BACKGROUND

The following discussion of the background is intended to facilitate an understanding of the present disclosure only. It should be appreciated that the discussion is not an acknowledgement or admission that any of the material referred to was published, known or is part of the common general knowledge of the person skilled in the art in any jurisdiction as of the priority date of the invention.

In view of the outbreak of infectious diseases, there exists an increased need for scheduled and routine cleaning. In particular, it has become nearly essential for routine disinfection of public or commonly accessed areas. There is also a general expectation for such disinfection to be done quickly and effectively so as to minimise disruptions to operations.

Existing solutions for providing disinfection includes robots equipped with ultraviolet (UV) radiation emitters as a means for providing disinfection. However, existing solutions suffer from various limitations such as inadequate coverage of UV light emitters, inadvertent exposure of UV to living beings, and inadequate heat management of UV light emitters.

There exists a need for an improved apparatus and/or system for providing disinfectant.

SUMMARY

Other aspects and features of the present invention will become apparent to those of ordinary skill in the art upon review of the following description of specific embodiments of the invention in conjunction with the accompanying figures.

According with an aspect of the invention there is an apparatus for disinfection comprising a cylindrical housing; a plurality of ultra-violet light emitting diode (UV-LED) modules disposed on the circumference of the cylindrical housing, each UV-LED module comprising a heat sink; and a heat dissipation module disposed along the central axis of the cylindrical housing, the heat dissipation module arranged in thermal contact with the heat sink of each of the plurality of UV-LED modules; wherein each of the plurality of UV-LED modules is pivotably mounted onto the circumference.

According with another aspect of the invention there is a system for disinfection comprising at least one AGV configured to provide disinfection to a predetermined area; the at least one AGV equipped with at least one ultra-violet light emitting diode (UV-LED) module and a location sensor; and a processor configured to receive location data from the AGV, the processor further configured to provide a route to the at least one AGV for disinfection of the area.

The at least one AGV may comprise a cylindrical housing; a plurality of ultra-violet light emitting diode (UV-LED) modules disposed on the circumference of the cylindrical housing, each UV-LED module comprising a heat sink; and a heat dissipation module disposed along the central axis of the cylindrical housing, the heat dissipation module arranged in thermal contact with the heat sink of each of the plurality of UV-LED modules; wherein each of the plurality of UV-LED modules is pivotably mounted onto the circumference According with another aspect there is a method for providing disinfection to a designated area comprising the steps of: (a.) providing at least one mobile apparatus for disinfection, the at least one mobile apparatus having at least one UV-LED module, the UV-LED module capable of being tilted with respect to a longitudinal axis of the mobile apparatus; (b.) receiving from the at least one UV-LED module at least one of the following data: a location of the mobile apparatus, an image, and/or an operation status; (c.) scheduling a disinfectant task; (d.) sending the disinfectant task to the at least one mobile apparatus; and (e.) receiving an update of task completion from the at least one mobile apparatus.

BRIEF DESCRIPTION OF DRAWINGS

In the figures, which illustrate, by way of example only, embodiments of the present invention, FIGS. 1a to 1g show an embodiment of the apparatus for providing a disinfectant in the form of a robot;

FIGS. 3a and 3b show a plurality of UV-LED modules pivotably mounted onto a mounting pillar/column;

FIGS. 3c to 3e illustrate the exposure of UV-C radiation in some embodiments wherein the robot is operated;

FIGS. 4a and 4b illustrate the operation of safety cover(s) to block the UV-C radiation under some operating scenarios;

DESCRIPTION OF EMBODIMENTS

Figure 2B:
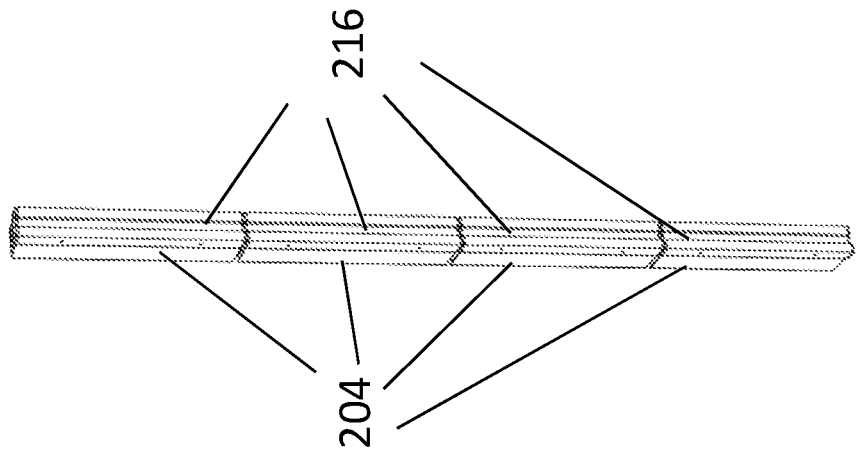
FIG. 2b shows a plurality of the UV-LED modules of FIG. 2a being stacked to form an extended length of UV-LED modules.

As used herein, the term "disinfection", "disinfecting", "disinfectant" and variants refer to the use of a method to at least minimize bacteria/germs/virus of an area. The terms include methods via physical, chemical contact and/or via exposure to radiation (e.g. exposure to the area to specific radiation such as ultra-violet radiation).

As used herein, the term "mobile" refers to an apparatus capable of moving from location to location.

As used herein, the term "associate", "associated", "associate", and "associating" indicate a defined relationship (or cross-reference) between at least two items. For instance, a plurality of devices (e.g. in the form of robots) may be controlled by a central server/processor and hence 'associated' with the central server/processor. In a group of robots, each robot may interact with another robot and hence be associated with one another.

As used herein, the term "network" can be any means of providing communication between one or more devices and/or content stored elsewhere. As used herein, network can be a personal area network, local area network, a storage area network, a system area network, a wide area network, a virtual private network, and an enterprise private network. The network can include one or more gateways or no gateways. The network communication can be conducted via published standard protocols or proprietary protocols.

As used herein, communication of data through any network can be: (i) encoded or unencoded; (ii) encrypted or unencrypted; (iii) delivered via a wired network, a wireless network, or a combination of wired and wireless. Wireless communication can be accomplished in any practical manner including a Wi-Fi 802.11 network, a Bluetooth™ network, or mobile phone network (such as 3G, 4G, LTE, and 5G). The terms "connected", "connected", and "connecting" as used herein refer to a communication link between at least two devices and can be accomplished as discussed in this paragraph.

As used herein, the term "computing device" may be a single stand-alone computer such as a desktop computer or a laptop computer, a thin client, a tablet computer, or a mobile phone. The computing device may run a local operating system and store computer files on a local storage drive. The computing device may access files and application through a gateway to one or more content repositories, the content repository can host files and/or run virtual applications and generate a virtual desktop for the computing device.

As used herein, the term "server" or "processor" may include a single stand-alone computer, a single dedicated server, multiple dedicated servers, and/or a virtual server running on a larger network of servers and/or cloud-based service. The processor may include integrated circuit (IC) chips such as application specific integrated circuit (ASIC) chips.

As used herein, the term "database" may include one or more data repositories to store data and access data from a single stand-alone computer, a data server, multiple dedicated data servers, a cloud-based service, and/or a virtual server running on a larger network of servers.

As used herein, the term "module" may include hardware, software, or combinations thereof to achieve a desired function. For example, a data module may include the necessary hardware and software to communicate with one or more sensors to send and receive data from the sensors.

As used herein, the term "sensor" or "sensors" include hardware sensors, software sensors and combinations of hardware and software sensors.

As used herein, the terms ultraviolet-C and "UV-C" include, but not limited to all UV-C radiation, short-wave ultraviolet, FAR-UV, deep UV etc. A UV-C radiation may be at a wavelength of 200 to 280 nanometres (nm).

As used herein, the term "real time" is used in the context of a computer processing term in relation to at least one of a hardware system and software system that are subject to a deadline or constraint and must guarantee response within specified time.

According to an aspect of the disclosure there is an apparatus for disinfection comprising a cylindrical housing; a plurality of ultra-violet light emitting diode (UV-LED) modules disposed on the circumference of the cylindrical housing; and a heat dissipation module disposed along the central axis of the cylindrical housing, the heat dissipation module arranged to dissipate heat away from each of the plurality of UV-LED modules; wherein each of the plurality of UV-LED modules is pivotably mounted onto the circumference of the cylindrical housing. Each of the plurality of UV-LED modules may include a heat sink. The heat sink may be in direct contact with a surface of the UV-LED modules.

Referring to FIGS. 1a to 1g, which show an embodiment of the apparatus in different views, the apparatus may be in the form of a robot 100 configured to perform disinfection of a designated area. The area may be predetermined or may be expanded or shrank on the fly in accordance with operational requirements. In some embodiments the robot 100 may be an autonomous ground vehicle (AGV) or an autonomous mobile robot (AMR). This robot 100 may be deployed in indoor and/or outdoor locations, including but not limited to various premises such as homes, office buildings, malls, public transportation, general public area, etc.

The robot 100 comprises a base portion 102 and a disinfectant tower 104. The base portion 102 includes mechanisms to enable the robot 100 to move. Such mechanisms may include wheels, guides, rollers, bearings, tracks etc. The base portion 102 may also include sensors arranged to detect objects for purpose of preventing collision with nearby objects or for obstacle avoidance and/or path tracking.

The disinfectant tower 104 may be attached to the base portion 102 via various mechanisms, including, but not limited to, snap-fit mechanisms, lock and flanges, bolts and nuts etc. The disinfectant tower 104 comprises a cylindrical housing 106 and a plurality of ultra-violet light emitting diode (UV-LED) modules 108 disposed on the circumference of the cylindrical housing 106. Each UV-LED module 108 may be equidistant with respect to an adjacent UV-LED module 108. In some embodiments, there may be four UV-LED modules. In some embodiments, there may be eight UV-LED modules. It is appreciable that the number of UV-LED modules 108 may be varied or configured according to operational requirements.

Each UV-LED module 108 may comprise at least one LED strip/panel having multiple LEDs arranged in the form of an LED array. The LED array is configured to emit ultraviolet radiation, and in particular UV-C radiation. The strip of LED array may be directly attached to the respective heat sink of each UV-LED module 108 via a thermally conductive adhesive. The disinfectant tower 104 may have a hollow central portion 110 shaped and dimensioned to receive a heat dissipation module 112 or the hollow central portion 110 may itself form the heat dissipation module or part thereof. The heat dissipation module 112 is disposed along the central axis of the cylindrical housing 106, the heat dissipation module 112 may be arranged in thermal contact with each of the plurality of UV-LED modules 108; and each of the plurality of UV-LED modules 108 may be pivotably mounted onto the circumference of the housing 106 such that each UV-LED module 108 may be pivoted and be tilted at an angle with respect to the surface of the housing 106. In some embodiments, the heat dissipation module 112 may include at least one mesh structure arranged and positioned to allow air to flow through a longitudinal axis (e.g. the central axis) of the device 100 so as to dissipate heat away from the UV-LED modules 108. In other embodiments, the heat dissipation module 112 may include one or more module containing refrigerant to facilitate heat transfer from each of the heat sinks of the UV-LED module 108 to the heat dissipation module 112.

In some embodiments, the disinfectant tower 104 can be attached onto the base portion 102. It is contemplated that power supply circuits and other components, control circuits may be positioned in various positions of the base portion 102 and housing 106. In addition, it is contemplated that the position (height) and illumination direction of an array of UV-C LED modules (pointing upward, downward, horizontal) can be controlled by the angle of tilt via control signals sent by one or more processors.

In some embodiments, normal LED light (in the form of LED strips) may be installed on the base portion 102 for visual indicator. Such LED strip may be mounted at a desired position of the base portion 102 to enable visual warnings while the robot 100 is in operation. The normal LED lights do not emit UV-C radiation.

In some embodiments, one or more connectors may be provided at the base portion for automatic docking and/or charging. The automation of docking and/or charging of one or more robots 100 is enabled as follows.

The location of each docking station can be stored into a memory unit (e.g. microprocessor chip) of the robot 100, or broadcast by a central server to multiple robots 100 in a fleet management system. When charging is required, the robot 100 identifies a nearest docking station based on calculation of a distance between its current location to each stored location, and moves to the nearest docking station. Sensors (for example, a camera) may be used to identify the relative posture of the robot 100 with respect to the nearest docking station when the robot 100 is within vicinity of the nearest docking station. Once the nearest docking station is detected, the robot 100 adjusts its posture/position to align with the docking station, and then move in a relatively straight manner to the docking station. Both the robot and docking station have interfaces, preferably arc-shaped interfaces for contacting/mating with each other. If the contacting/mating fails, the robot moves away from the docking station, performs the alignment and moves to the docking station again for contact.

The one or more connectors may include serial bus connector, parallel bus connector, universal serial bus connector and other known connectors that can provide power and/or data. The base portion 102 can also include power supply and circuitries for converting alternating current (AC) to direct current (DC).

Cooling vents 114 may be positioned between each pair of adjacent LED module 108. The cooling vents 114 are arranged to facilitate the passage or flow of air from the base portion 102 through the tower portion 104 and out a top portion 116 of the robot 100. The cooling vents 114 may be regarded as air inlets and/or outlets and may be formed from/of mesh like material such as, but not limited to Carbon steel, Stainless steel, Aluminium, Zinc or other metallic compounds or elements suitable for forming the mesh like material.

Figure 2A:
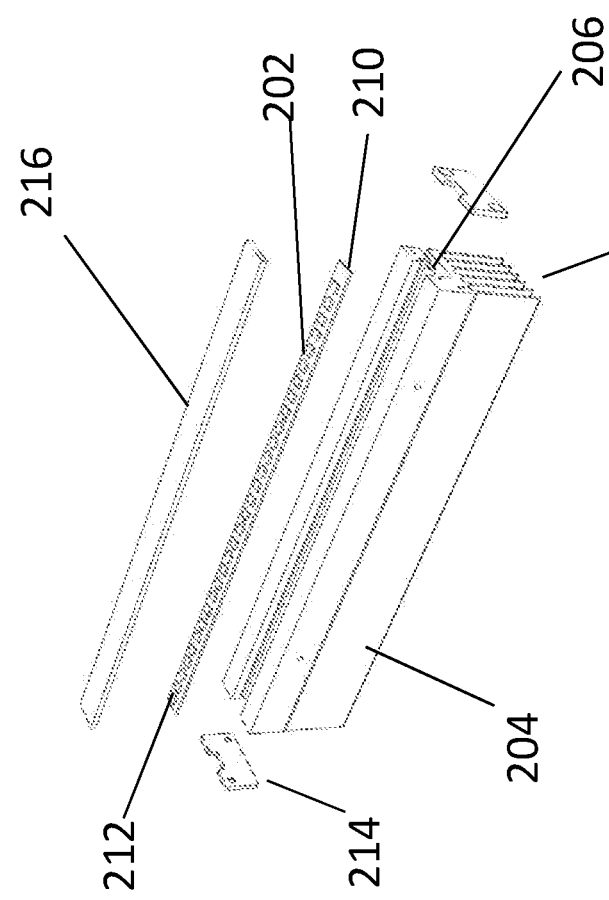
FIG. 2a is an exploded view of a UV-LED module for providing disinfection according to some embodiments.

FIG. 2a is an exploded view of an embodiment of the UV-LED module 108. The UV-LED module 108 comprises a LED array 202 and a heatsink 204 shaped and dimensioned to receive the LED array 202. The heatsink 204 may include a slot 206 to receive the LED array 202 in a way such as to maximize thermal contact with the LED array 202. The heatsink 204 may include a plurality of fins 208 operable to facilitate dissipation of heat away from the LED array 202. The LED array 202 may be mounted onto a printed circuit board (PCB) 210. In addition to the LED array 202, the PCB 210 may include other components such as indicator lights 212 operable to display various operation statuses.

The LED array 202 is operable to emit UV-C radiation, and may be secured in place within slot 206 using end caps 214. In addition, there comprises a transparent cover 216 to overlay the LED array 202 such that is provides a protective cover to the LED array 202, PCB 210 against dirt or small particles without hindering the emission of the UV-C radiation. In some embodiments, the transparent cover 216 may be formed from/of glass material.

FIG. 2b shows another embodiment wherein a plurality of the UV-LED modules 108 are arranged adjacent one another such as to form an 'extended' strip. The arrangement may be formed by stacking one UV-LED module 108 breadthwise on top of another UV-LED module 108. Other arrangements of stacking the UV-LED modules 108, for example, stacking the UV-LED modules 108 lengthwise on top of one another, are contemplated.

The robot 100 may include additional UV-LED modules 108 disposed on the top portion 116 of the robot 100 (see FIG. 1f). The additional UV-LED modules 108 are operable to emit UV radiation around a top region of the robot 100.

FIGS. 3a and 3b is another embodiment showing a plurality of UV-LED modules 108 mounted onto a mounting pillar/column 302. At least one of the UV-LED modules 108 is pivotable with respect to the mounting column 302. This is achievable via a mounting bracket 304 attached to the UV-LED module 108, the mounting bracket 304 which in turn is pivotably attached onto the mounting column 302 via a pivot point 306. The pivot point 306 may include a rotating mechanism connected to a motor, wherein the motor can be actuated to turn the rotating mechanism which in turn effect turning of the UV-LED module 108. It is contemplated that the turning of each UV-LED module 108 allow the robot 100 to control the spread of UV-C light (360 degree or directional) in accordance with disinfection requirement.

FIGS. 3c to 3e illustrate the exposure of the UV-C radiation in some embodiments wherein the robot 100 is operated. Based on operational requirements, the number of UV-LED modules 108 can be varied so as to achieve a 360 degree spread (see FIG. 3c) or near 360 degree spread. The UV-LED modules 108 positioned on the top portion of the robot 100 will expose the UV radiation to a roof portion of a ceiling portion of an enclosed area to take care of ceiling disinfection (FIGS. 3d and 3e). As shown in FIG. 3e, The UV-C LED modules located at an area near the base portion 102 (example a bottom row) can be tilted to be pointed to a floor portion. Such an arrangement is advantageous to increase the disinfection coverage of the robot 100.

FIGS. 4a and 4b show an embodiment of the robot 100 having one or more safety barriers in the form of opaque covers 402 operable to cover one or more UV-LED module(s) 108. Multiple opaque covers 402 may be positioned along a movable linkage, for example conveyor belt 404. The conveyor belt 404 is arranged parallel to the circumference of the housing 106. The conveyor belt 404 can be made movable via an actuator 406. The actuator 406 can include one or more motor-gear assemblies.

In operation, the actuator 406 moves the link 404, which in turns moves the radiation barriers 402. In the embodiment of FIG. 4a, when the linkage is moved in an anti-clockwise direction, the opaque cover(s) 402 will be moved such that they cover the UV-LED module(s) 108 and thus preventing or minimizing UV radiation emitted from the robot 100. This may correspond to operational situations where the robot 100 encounters a living being in its path and temporarily stop the disinfection process to avoid UV radiation from hitting the living being without full deactivation of the robot 100. When the linkage is moved in a clockwise direction, the opaque cover(s) 402 are moved such that the at least one UV-LED module 108 is uncovered.

FIG. 4b shows a view of the radiation barrier 402 arrangement on the top portion 116. The linkage 404 moving left will move cover 402 over the LED module 108 while moving right will move the cover 402 away from the LED module 108.

As an alternative or an addition, the intensity of the UV radiation may be reduced when the robot 100 detects a nearby living being.

The UV-LEDs may emit copious amounts of heat in operation, and therefore heat dissipation is an important design consideration. The tower 104 includes a cooling system based on a combination of at least one fan, airflow, liquid, fluid. Where a liquid refrigerant is used, a conduit may be positioned along a length of each heat sink 204. When liquid refrigerant is passed through the conduit heat may be removed from heat sink 204 via heat transfer from the heat sink 204 to the conduit. In some embodiments, one or more heat exchanger devices may be arranged in the vicinity of the heat sinks 204 to facilitate removal of heat from the heat sinks. In some embodiments, a radiator (or other suitable heat exchanger device) may be positioned on a top portion of the robot 100 to facilitate heat transfer.

Figure 5B:
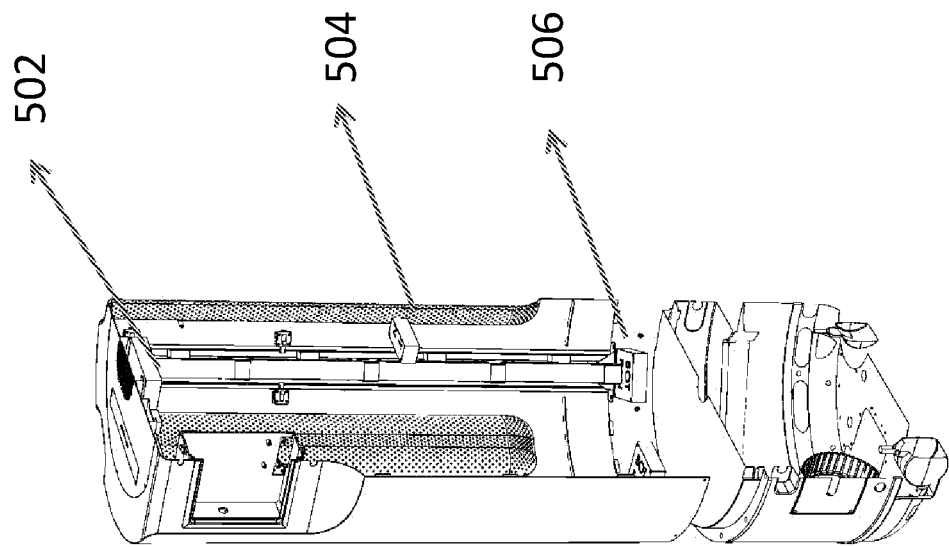
FIGS. 5a and 5b illustrate an embodiment of the heat dissipation module that include fans.
Figure 5A:
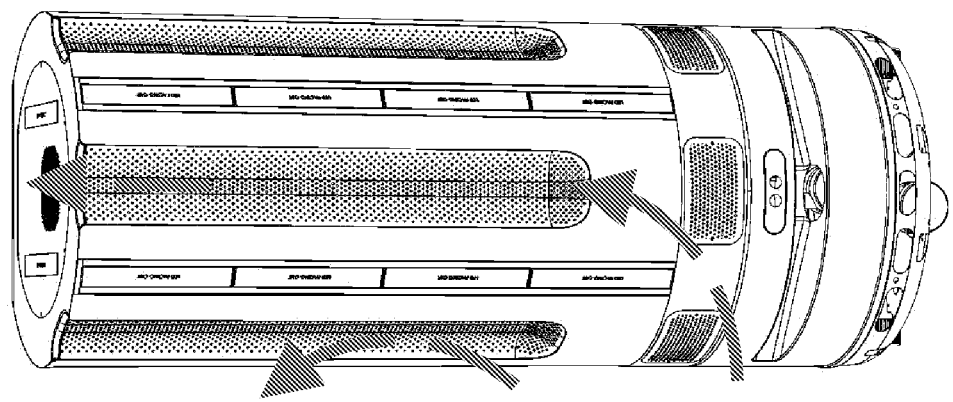

In an embodiment shown in FIGS. 5a and 5b, the heat dissipation module 112 include fans 502, 504, 506 are located at the top portion 116 and bottom portion 118 of the disinfectant tower 104 to promote laminar air flow along the longitudinal axis of the tower 104. Such an arrangement advantageously dissipates heat away from the heat sink fins of each UV-LED module 108. It is contemplated that any number of fans may be positioned at different locations along the longitudinal axis of the tower 104 to facilitate air flow.

Openings or air vents 114 may also be provided on the top portion 116 of the housing 106 to dissipate heat generated within the tower 104 to the external environment.

Sensors may be positioned on different locations to detect operational parameters such as internal and environmental temperature, presence of obstacles, presence of living beings, battery remaining, location and range sensors for navigation etc. In particular, as UV-C LED is regarded as a high-power application, power distribution and monitoring system is critical to ensure/maximize stable and safe operation.

Figure 6:
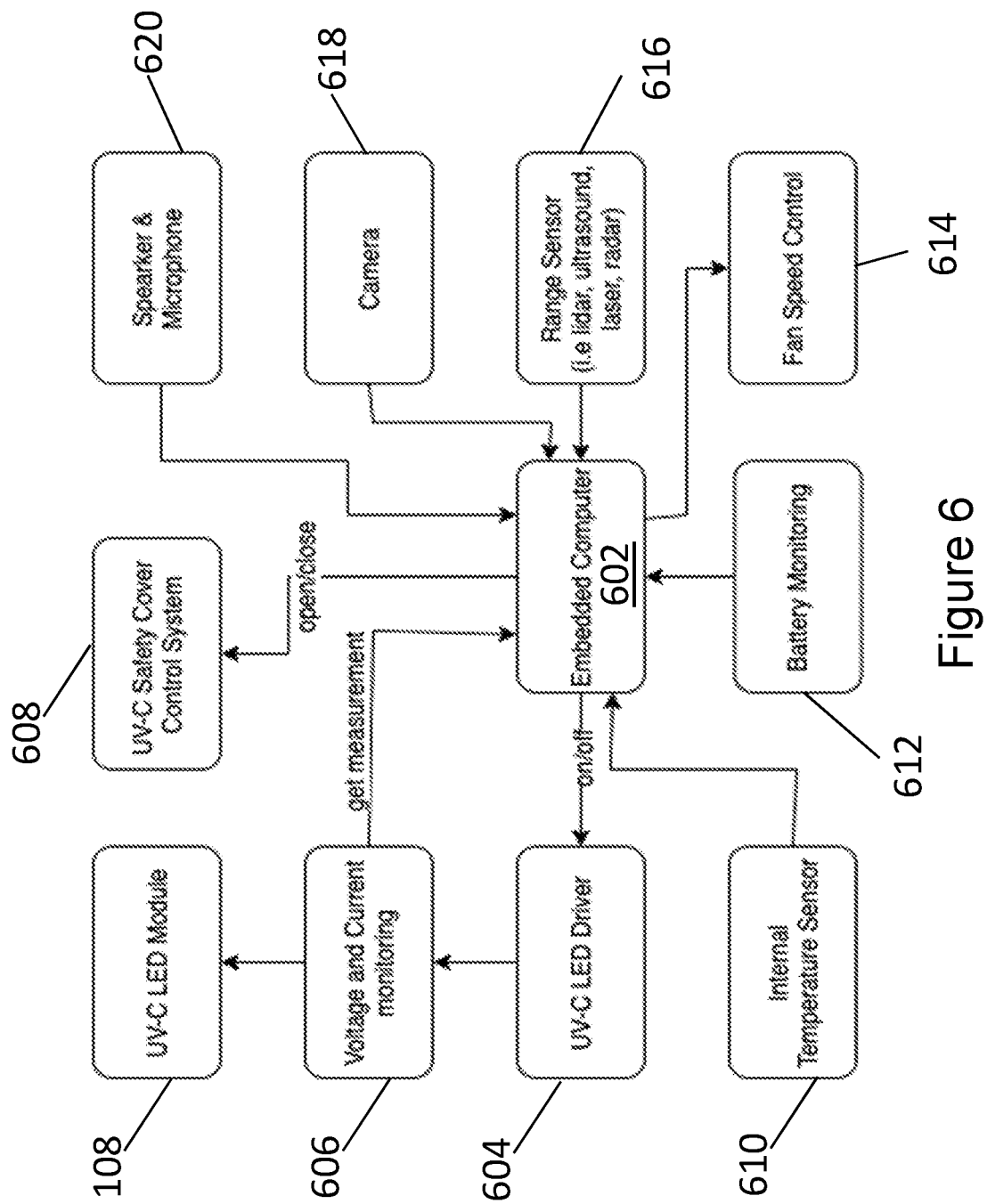
FIG. 6 shows a power and/or control system that enables the robot to be autonomous.

FIG. 6 is a diagram showing a possible embodiment of a power and/or control system that enables the robot 100 to be autonomous. The hardware architecture 600 comprise an embedded computer 602 configured to receive input from one or more modules and/or send control/operational signals to the one or more modules. The embedded computer 602 may include one or more application specific integrated circuit (ASIC). Embedded computer 602 may include non-transitory computer readable medium such as storage medium (e.g. random access memory RAM, read-only memory ROM, etc.) with software codes installed thereon such that when executed, runs the control logic to operate the robot 100. The embedded computer 602 includes key components that coordinate various hardware components.

The embedded computer 602 is arranged in data communication with at least one of the following modules: UV-C module 108, UV-C driver module 604, voltage and current monitoring 606, UV-C safety cover control system 608, internal temperature sensor module 610, battery monitoring module 612, fan speed control module 614, range sensor module 616, image capturing module 618, sound input/output module 620.

The UV-C driver module 604 operates to provide constant current to LED module. The driver module 604 may include electrical and/or electronic components so as to minimize current ripple(s) sent to the LED module 108. In some embodiments, the UV-C driver module 604 may include electrical and/or electronic components also operate to allow on/off and adjustment of intensity or one or more of the UV-C LED modules 108. The driver module 604 may also include short-circuit and/or open-circuit protection circuit(s) or components to protect the LED module against surges in current/voltage.

The voltage and current monitoring module 606 operates to monitor the actual voltage and sense the current going into each LED Module 108 and is arranged to send real-time voltage and current measurements to the embedded computer 602.

The UV-C safety cover control system 608 receives control signals from the embedded computer 602 and sends actuating signals to the actuator 406 to control the radiation barrier 402.

The internal temperature sensor module 610 monitors the temperature of the robot 100, in particular temperature(s) around the UV-C LED module 108, and sends periodic or real-time temperature measurements to the embedded computer 602.

The battery monitoring module 612 monitors battery voltage and output current, allow estimation of capacity left as well as monitoring stability of output voltage and current. These information are sent to the embedded computer 602.

The fan speed control module 614 operates to receive control signals from the embedded computer 602 for the control of the speed of each fan 502, 504 or 506. The speed of each fan 502, 504 and 506 can therefore be the same or differ from one another so as to achieve dynamic control of internal air flow to meet heat dissipation requirements.

The range sensor module 616 may include robotic Sensor (Lidar, ultrasonic, laser, radar, IMU)—these sensors are used for navigation as well as detecting distance of any object nearby the robot (especially human). Location and sensor data may be sent periodically or on a real-time basis to the embedded computer 602.

The image capturing module 618 may include a camera capturing device such as a camera or a multimedia recorder. Data from the captured images may be sent periodically or on a real-time basis to the embedded computer 602. The data allows visual understanding of environment around the robot 100 so as to enable the embedded computer 602 to make logic decisions and send control signals to the UV-C safety cover control system 608, the UV-C driver module 604, and/or the fan speed control module 614.

The sound input/output module 620 can include a speaker and a microphone to allow sensing of the surrounding, play alarm message as well as perform two ways voice communication. The sound data received from the sound input/output module 620 are sent to the embedded computer 602 for further processing to make logic decisions and send control signals to the UV-C safety cover control system 608, the UV-C driver module 604, and/or the fan speed control module 614. The interactions between the various modules enable the robot 100 to monitor internal system health and external environment conditions for public safety.

Figure 7:
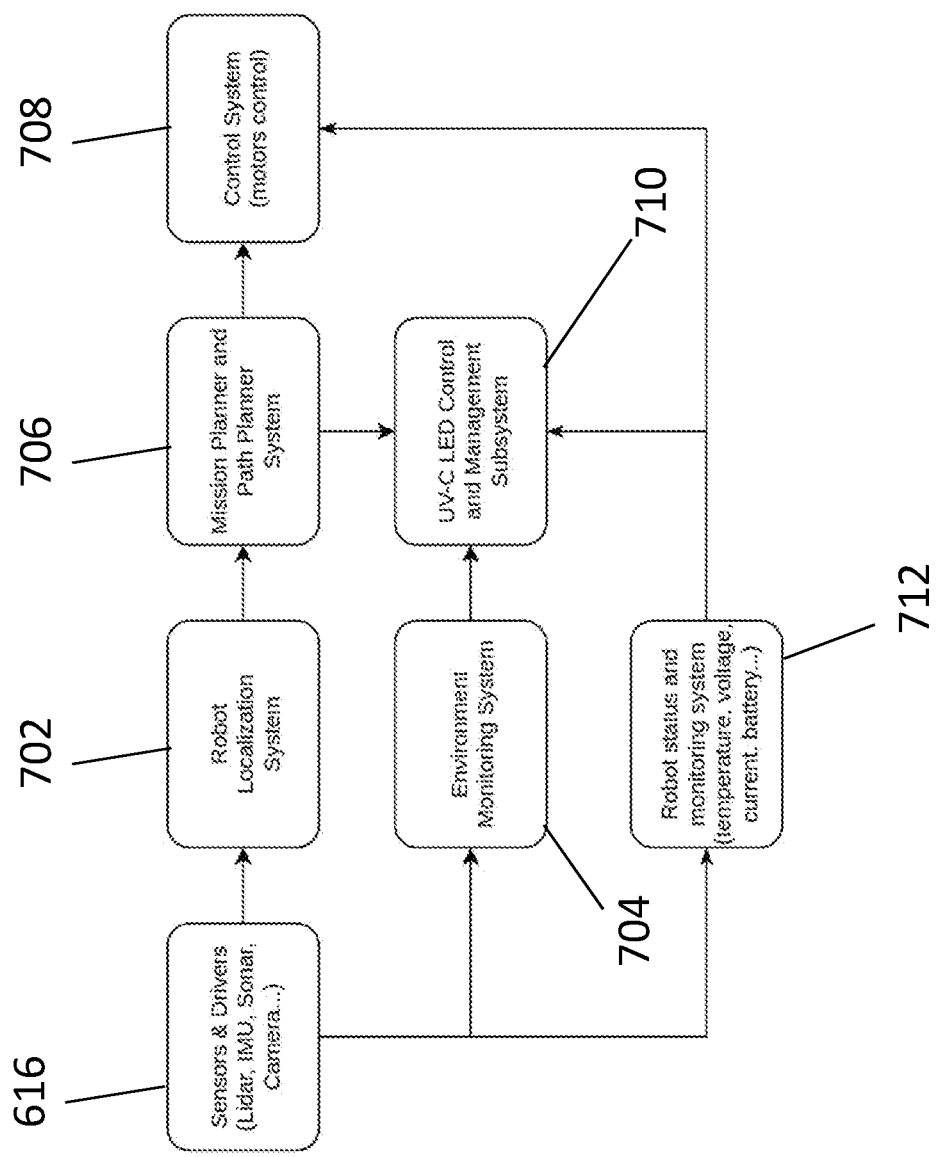
FIG. 7 shows a robot localization system and environmental monitoring system for planning a disinfection schedule/plan.

In some embodiments, data from the range sensor module 616 and image capturing module 618 may form a dataset or part thereof for a robot localization system and an environment monitoring system. The dataset may include location data and any image data. Referring to FIG. 7, the robot localization system 702 and environmental monitoring system 704 receives data from the range sensor module 616 and image capturing module 618 as inputs and provide output data, in the form of unique labels of obstacles (e.g. landmarks), persons, locations, dimensions and/or velocities to a route planner 706. The route planner 706 may include a mission (i.e. disinfectant objective) planner and a path planner system. The mission planner provides one or more task lists associated with the robot 100. For example, the mission planner provides the next target location, when to switch on/off the UV disinfection. The path planner plans the trajectory or path to be taken from a current location to the next target location, taking into account possible obstacles along the way and to avoid such obstacles. The route planner 706 may provide control signals to a control system 708 for movement control of the robot 100 and a UV-C LED control and management subsystem 710. Optionally, the range sensor module 616 may be arranged in data or signal communication with a robot status and monitoring system 712. The robot status and monitoring system may include hardware and/or software combinations, such as an input module, to receive sensor data related to the robot 100. The sensor data can include temperature, voltage, current, battery consumption etc.

Figure 8:
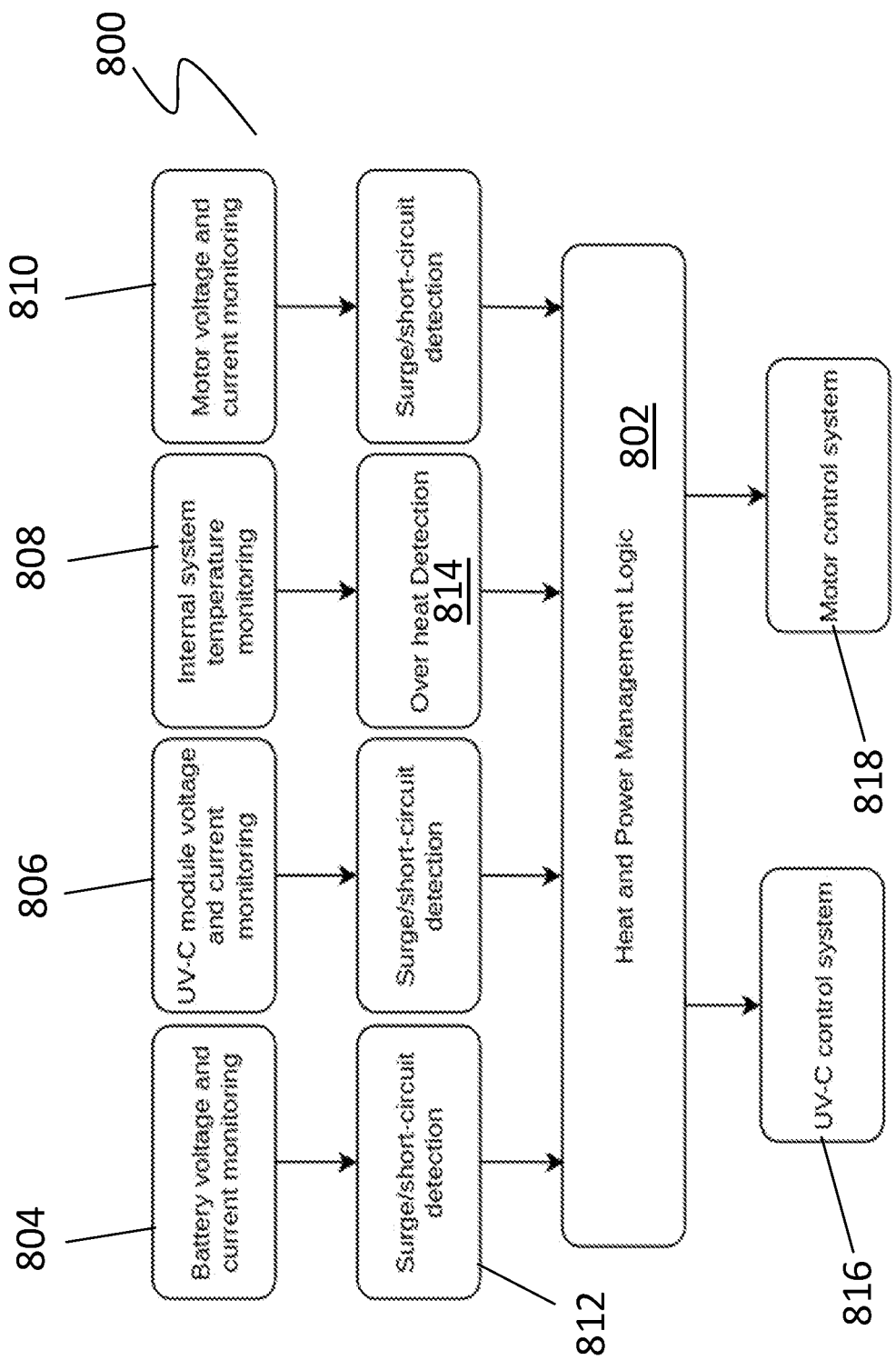
FIG. 8 shows a heat and power management system associated with the robot.

FIG. 8 shows an embodiment of a heat and power management sub-system 800 that can form part of the control system or sub-system of the robot 100. The heat and power management logic 802, which can be stored in the embedded computer 602, can be executed to receive input from the a battery voltage and current monitoring sub-system 804, a UV-C module voltage and current monitoring sub-system 806, an internal system temperature monitoring sub-system 808 and a motor voltage and current monitoring sub-system 810. Each of the sub-systems 804, 806, 808 and 810 may in turn contain surge detection/short-circuit detection modules 812 and over-heat detection modules 814. Each of the sub-systems 804, 806, 808, 810 may be derived from or may obtain data from the UV-C LED module 108, UV-C LED driver 604, battery monitoring module 612, the voltage and current monitoring module 606 and the internal temperature sensor module 610 to determine whether there is a short-circuit, a surge in voltage, current and/or over-heating. If a short-circuit, a surge or overheating is detected, the heat and power management logic 802 will operate to send control signal, via the embedded computer 602, to a UV-C control system 816 and/or a motor control system 818. The UV-C control system and/or the motor control system 818 may in turn send control signals to the fan speed control module 614, UV-C driver module 604, and/or UV-C safety cover control system 608 to mitigate or resolve the short-circuit, surge and/or over-heating. Such control signals may be electronic signals.

Figure 9:
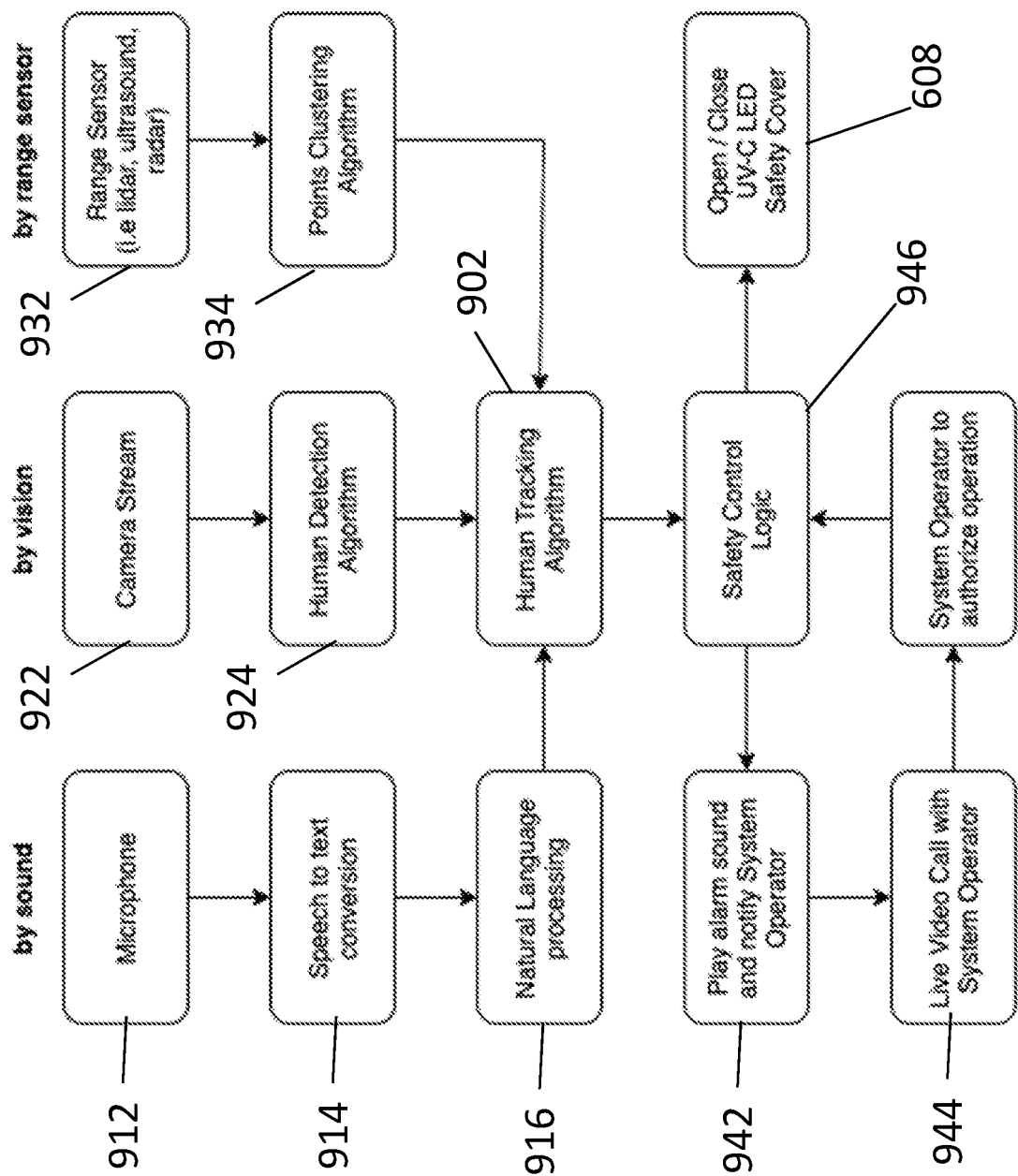
FIG. 9 shows an environment monitoring subsystem for detection of a living being.

FIG. 9 shows an embodiment of an environment monitoring subsystem 900. This may be regarded as a system to effect at least one of the following:

(a.) Living being (e.g. human detection) detection—Upon detecting a human being within an operating radius (also known as a disinfection radius), the robot 100 operates to stop the UV-C LED from emitting UV-C radiation. The detection may be based on at least one of a sound, an image, and a location.

(b.) Remote activation—voice based control of the robot 100 to remotely turn on/off the robot 100

(c.) Alarm in case of abnormality—In case of any abnormality, e.g. human detection, the safety cover control system 608 will effect movement of the cover 402 to prevent UV-C emission and may become stationary. The disinfectant activity will be temporarily halted. When the person has left the area surrounding the robot, the robot can then resume operation. The robot 100 may be operated in a manual authorization mode such that if the robot is in a manual authorization mode, a user, for example a system operator, will need to authorize before the robot 100 can open the cover 402 and continue the disinfection work.

Referring to FIG. 9, the environmental monitoring subsystem includes a human tracking module 902 configured or programmed to receive input from the sound input/output module 620, image capturing module 618 and range sensor module 616.

A microphone 912 of the sound input/output module 620 operates to receive sound and once sound is received it is converted to text via a speech to text conversion module 914. The converted text is then sent to a natural language processing module 916 before being sent to the human tracking module 902.

The image capturing module 618 operates to capturing a plurality of images 922 and upon detection of a living being (e.g. human), the images are sent to a human detection module 924, the output of the human detection algorithm can then be sent to the human tracking module 902. Non-limiting examples of such output include a unique label/identifier associated with each person detected, one or more locations, one or more dimensions and one or more velocities of each detected person.

The range sensor module 616 receives data (sensor data) from the respective sensors 932. The sensor data are then sent to a clustering analysis module 934, wherein the data undergoes clustering analysis via a points clustering algorithm. The output of the points clustering algorithm is then sent to the human tracking module 902. Non-limiting examples of the output of the points clustering algorithm may include a unique label/identifier associated with each point cluster, and all the points in each identified cluster.

The human tracking module 902 executes a human tracking algorithm to determine if a human being has been detected. If the human tracking algorithm ascertains that a human being is detected and the location of the human, a safety control logic module 904 is activated to execute an alarm 942, and/or open/close the safety cover via the safety cover control system 608. Once the alarm is executed, a system operator may be notified 944 to activate manual control of the safety control logic module 946.

Figure 10:
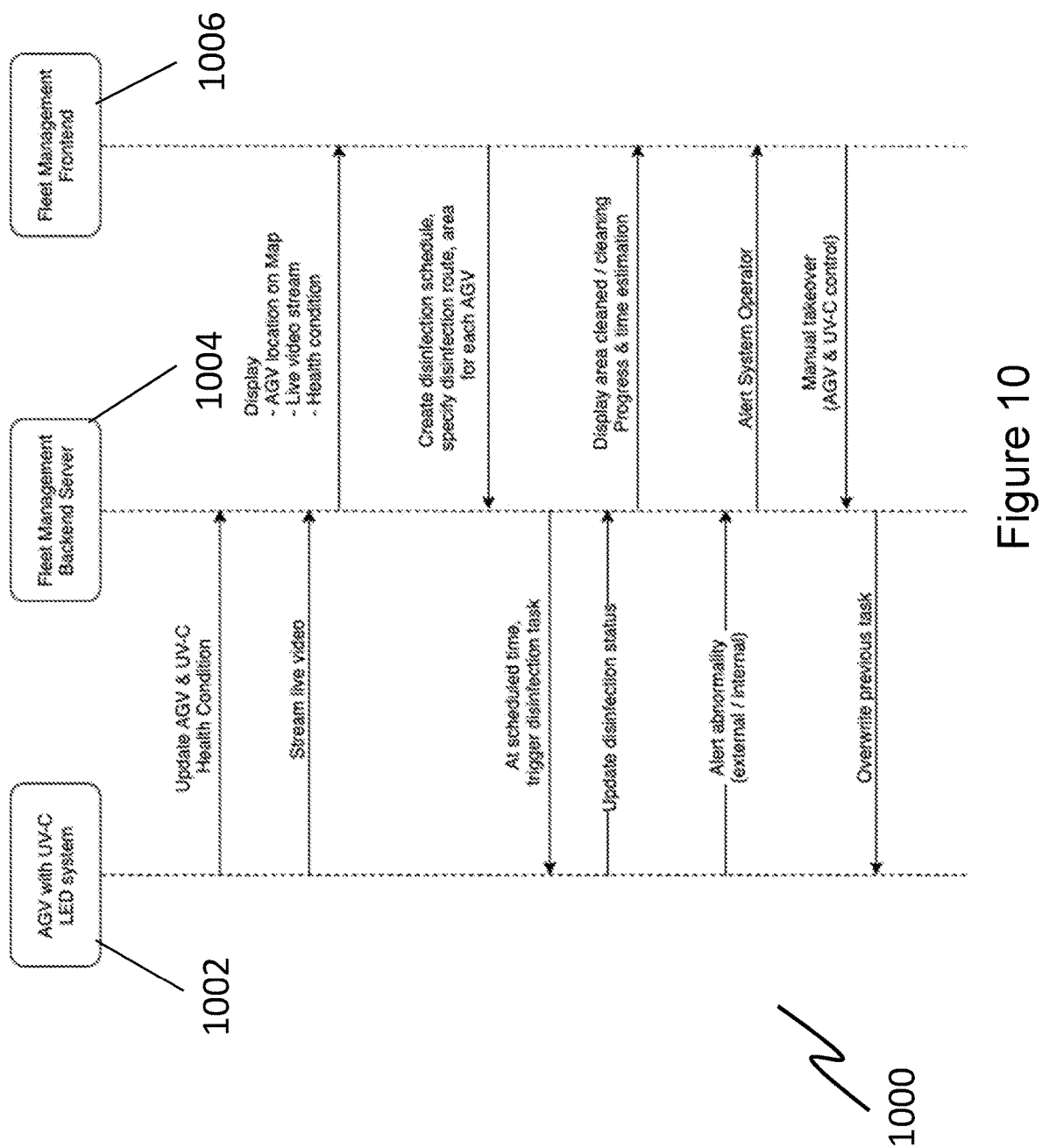
FIG. 10 illustrates a fleet management system of a plurality of disinfection robots in the form of AGVs.

FIG. 10 shows another aspect of the disclosure in the form of a system for providing disinfection 1000. The system 1000 comprises at least one apparatus 1002 for providing disinfectant. The apparatus 1002 is equipped with the necessary sensors to provide updates of its location and operational condition(s) or 'health' (for example battery life, UV emission strength, temperature etc.) to a backend server 1004. The apparatus 1002 can be connected to the backend server 1004 via a network. The backend server 1004 may include one or more databases for storage of data associated with each apparatus 1002. Each apparatus 1002 may also stream images (in the form of multimedia files or videos) on a real time basis to the backend server 1004.

The backend server 1004 is connected with a fleet management frontend 1006. The fleet management frontend 1006 may be a computing device provided with a user interface. The user interface may include one or more touch screens. In some embodiments, the fleet management frontend 1006 may be part of a dedicated application (colloquially known as an 'app') installed on the computer device. The backend server 1004 may cause at least one of the following to be displayed on the frontend 1006: each apparatus 1002 location on a map, a live video stream of a selected apparatus 1002, and the health condition of a selected apparatus 1002.

A user may make use of the frontend 1006 to create a disinfection schedule associated with each apparatus 1002, to specify a route, path or disinfection area associated with each apparatus 1002. Such information may be then sent to the backend server 1004.

At a scheduled time associated with an apparatus 1002, the backend server 1004 will activate the apparatus 1002 to perform the disinfection task. The apparatus 1002 can also send periodic and/or real time status to the backend sever 1004. Once the disinfection task is completed or progressed to a certain stage, the backend server 1004 operates to send a notification to the frontend 1006. The notification may be in the form of a message displayed on the dedicated app. Additional notifications such as emails or SMS notifications may be sent as necessary/preferred by a user.

Each apparatus 1002 may be configured to send an alert to the backend server 1004 whenever an abnormality is detected. Examples of abnormality include low battery power, temperature exceeding a predetermined threshold, fault associated with one or more disinfectant module (e.g. UV-C LED module) etc. Once the alert is sent the backend server 1004, the backend server 1004 may operate to halt the disinfectant task and/or allow manual takeover by an authorized user, such as a system operator.

In addition to the above, the backend server 1004 may control one or more apparatus to dock and/or charge as and when required.

In accordance with another aspect of the invention there is a method for providing disinfection to a designated area comprising the steps of: providing at least one mobile apparatus for disinfection, the at least one mobile apparatus having at least one UV-LED module; receiving from the at least one UV-LED module at least one of the following data: a location of the mobile apparatus, an image, and/or an operation status; scheduling a disinfectant task; sending the disinfectant task to the at least one mobile apparatus; and receiving an update of task completion from the at least one mobile apparatus; wherein when an abnormality is detected, sending the abnormality to a system operator.

The apparatus 100 as described is advantageous in that it uses an array of UV-C LED with a comprehensive heat dissipation arrangement to reduce power requirement of whole system and increase range of disinfection. Compared with prior art solutions that use mercury lamp for example, the power consumption of UVC is at least 70% lower than mercury lamp, the effective range 100% longer than mercury lamp, and the UV-C module 108 pivotably mounted enables fine-tuning of UV radiation to be achieved.

In addition, the modular design and mounting structure allow ease of swapping, replacement and maintenance of each UV-C LED module 108.

Figure 11:
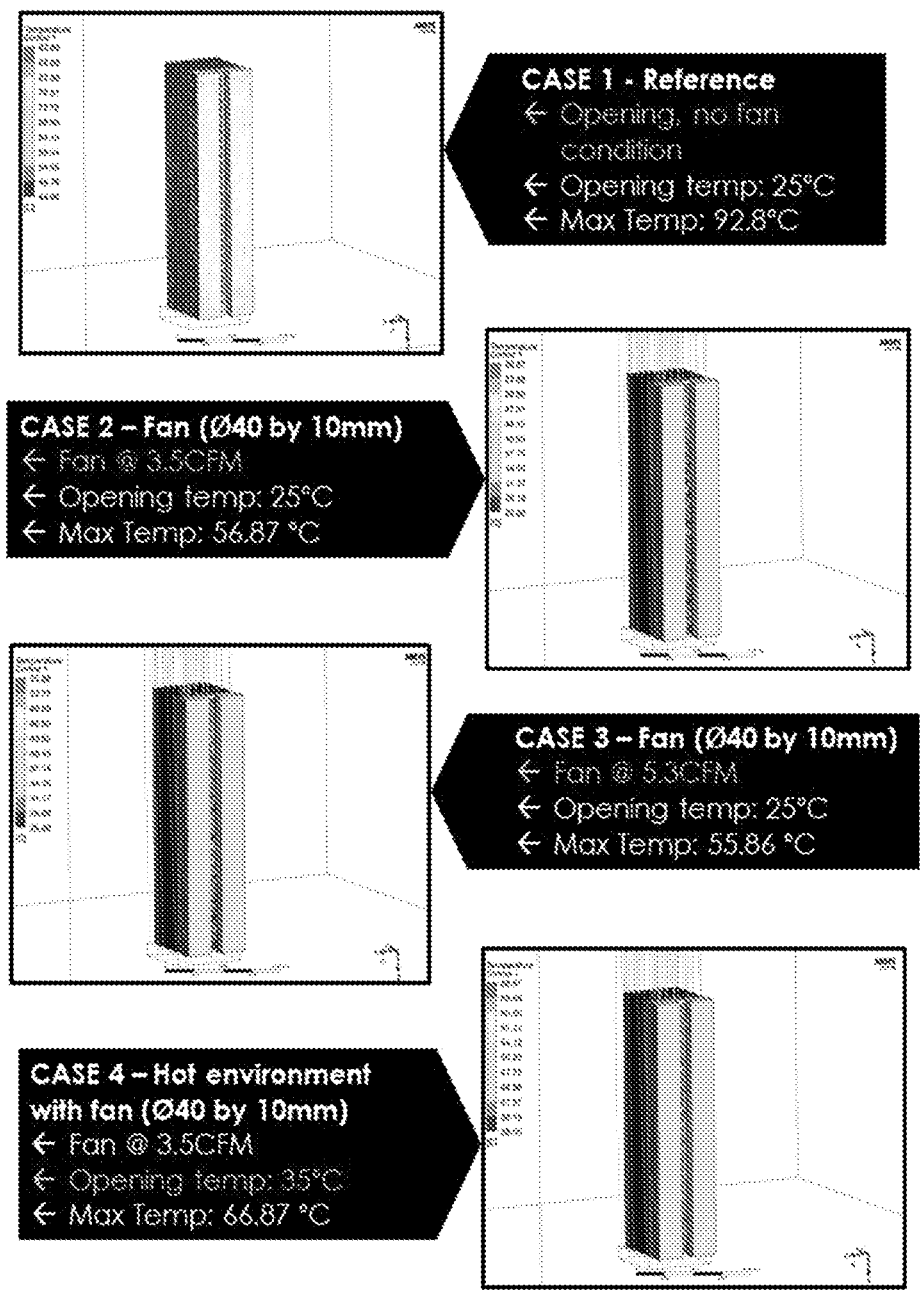
FIG. 11 shows various experiments demonstrating the efficiency of using a heat dissipation module to promote air flow through the longitudinal axis of the robot.

FIG. 11 shows various experiments demonstrating the efficiency of using a heat dissipation module to promote air flow through the longitudinal axis of the robot 100. Compared to operating the robot 100 without and active generation of air flow (via fans or blower mechanisms for example), it is shown that the removal of heat using active generation of air flow is able to reduce the maximum temperature considerably.

It should be appreciated by the person skilled in the art that variations and combinations of features described above, not being alternatives or substitutes, may be combined to form yet further embodiments falling within the intended scope of the invention.

The invention claimed is:

1. An apparatus for disinfection comprising
a cylindrical housing;
a plurality of ultra-violet light emitting diode (UV-LED) modules disposed on the circumference of the cylindrical housing, each UV-LED module comprising a heat sink; and
a heat dissipation module disposed along the central axis of the cylindrical housing, the heat dissipation module arranged in thermal contact with the heat sink of each of the plurality of UV-LED modules;
wherein each of the plurality of UV-LED modules is pivotably mounted onto the circumference.

2. The apparatus of claim 1, wherein at least one of the plurality of UV-LED modules is configured to emit an UV-C radiation.

3. The apparatus of claim 1, wherein the UV-C radiation has a wavelength of 200 to 280 nanometers (nm).

4. The apparatus of claim 1, further comprises a safety cover assembly, the safety cover assembly comprises a belt positioned parallel to the circumference of the cylindrical housing, and a slidable cover is arranged to slide in a direction parallel to the circumference of the cylindrical housing.

5. The apparatus of claim 1, further comprises at least one end cap, the at least one end cap adapted to accommodate an UV-LED module.

6. The apparatus of claim 1, wherein the heat dissipation module comprises a plurality of fans positioned to direct air from a first end of the cylindrical housing to a second end of the cylindrical housing.

7. The apparatus of claim 1, wherein the heat dissipation module further comprises a plurality of ventilation columns, each ventilation column arranged to be positioned between two ultra-violet light emitting diode (UV-LED) modules.

8. The apparatus of claim 1, wherein at least one fan of the plurality of fans is positioned along the longitudinal axis of the central axis to direct air along the central axis.

9. The apparatus of claim 1, wherein the apparatus is an automated guided vehicle (AGV) or an autonomous mobile robot (AMR).

10. The apparatus of claim 9, wherein the AGV is equipped with at least one of the following sensors: image sensor, sound sensor, temperature sensor, electrical voltage sensor, electrical current sensor, light sensor, location sensor.

11. A system for disinfection comprising
at least one AGV configured to provide disinfection to a predetermined area; the at least one AGV comprising:
a cylindrical housing;
a plurality of ultra-violet light emitting diode (UV-LED) modules disposed on the circumference of the cylindrical housing, each UV-LED module comprising a heat sink;
a heat dissipation module disposed along the central axis of the cylindrical housing, the heat dissipation module arranged in thermal contact with the heat sink of each of the plurality of UV-LED modules; and
a location sensor; and
a processor configured to receive location data from the AGV, the processor further configured to provide a route to the at least one AGV for disinfecting the area.

12. The system of claim 11, wherein the AGV is further equipped with at least one of the following sensors: image sensor, sound sensor, temperature sensor, electrical voltage sensor, electrical current sensor, light sensor.

13. The system of claim 12, wherein the at least one sensor is arranged in signal or data communication with a safety module, the safety module arranged in signal or data communication with the processor, the safety module configured to receive input from the at least one sensor to determine if a living being is present and if so, the safety module is arranged to send an output to the processor to minimize or block radiation emitted from the at least one UV-LED module.

14. The system of claim 11, further comprises a fleet management module to manage a plurality of AGVs, wherein the fleet management module is configured to receive an operation status input from the plurality of AGVs and receive a configuration input from a user device.

15. The system of claim 14, wherein the user device is a mobile device.

16. A method for providing disinfection to a designated area comprising the steps of:
  (a.) providing at least one mobile apparatus for disinfection, the at least one mobile apparatus having:
    a cylindrical housing;
    a plurality of ultra-violet light emitting diode (UV-LED) modules disposed on the circumference of the cylindrical housing, each UV-LED module comprising a heat sink;
    a heat dissipation module disposed along the central axis of the cylindrical housing, the heat dissipation module arranged in thermal contact with the heat sink of each of the plurality of UV-LED modules, wherein each of the plurality of UV-LED modules is capable of being tilted with respect to a longitudinal axis of the mobile apparatus;
  (b.) receiving from the plurality of UV-LED modules at least one of the following data: a location of the mobile apparatus, an image, and/or an operation status;
  (c.) scheduling a disinfectant task;
  (d.) sending the disinfectant task to the at least one mobile apparatus; and
  (e.) receiving an update of task completion from the at least one mobile apparatus.

* * * * *